United States Patent
Lee et al.

(10) Patent No.: US 10,462,911 B2
(45) Date of Patent: Oct. 29, 2019

(54) HIGH-CURRENT TRANSMITTING METHOD UTILIZING PRINTED CIRCUIT BOARD

(71) Applicant: LG CHEM, LTD., Seoul (KR)

(72) Inventors: Chang Hui Lee, Cheonan-Si (KR); Dong Hyun Kim, Sejong-Si (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/758,217

(22) PCT Filed: Mar. 21, 2017

(86) PCT No.: PCT/KR2017/003005
§ 371 (c)(1),
(2) Date: Mar. 7, 2018

(87) PCT Pub. No.: WO2017/213333
PCT Pub. Date: Dec. 14, 2017

(65) Prior Publication Data
US 2018/0255648 A1    Sep. 6, 2018

(30) Foreign Application Priority Data

Jun. 7, 2016  (KR) ........................ 10-2016-0070347

(51) Int. Cl.
*H05K 1/11* (2006.01)
*H05K 3/42* (2006.01)
(Continued)

(52) U.S. Cl.
CPC .............. *H05K 3/42* (2013.01); *H05K 1/0265* (2013.01); *H05K 1/09* (2013.01); *H05K 1/115* (2013.01);
(Continued)

(58) Field of Classification Search
CPC ........ H05K 1/115; H05K 1/112; H05K 1/113; H05K 1/114; H05K 1/116; H05K 3/4038;
(Continued)

(56) References Cited

U.S. PATENT DOCUMENTS 5,404,637 A    4/1995  Kawakami
6,217,987 B1 *  4/2001  Ono ........................ G03F 7/032
                                                    174/250
(Continued)

FOREIGN PATENT DOCUMENTS

JP       2804084 B2    9/1998
JP    2000-94443 A     4/2000
(Continued)

OTHER PUBLICATIONS

International Search Report issued in PCT/KR2017/003005 (PCT/ISA/210), dated May 23, 2017.

*Primary Examiner* — Jeremy C Norris
(74) *Attorney, Agent, or Firm* — Birch, Stewart, Kolasch & Birch, LLP

(57) ABSTRACT

The present disclosure relates to a structure and a method for filling a via hole formed in a multilayer printed circuit board, and more particularly, to a structure and a method for filling a via hole formed in a multilayer printed circuit board, the structure and method enabling high-current transmission even in a narrow space in such a way that a via hole formed when a typical multilayer printed circuit board is manufactured is first filled with Cu and Ag plating, and the remaining vacant space is completely filled with a solder cream, thereby increasing the amount of conductors.

6 Claims, 4 Drawing Sheets

(51) Int. Cl.
| | |
|---|---|
| *H05K 3/06* | (2006.01) |
| *H05K 1/09* | (2006.01) |
| *H05K 3/00* | (2006.01) |
| *H05K 3/28* | (2006.01) |
| *H05K 3/46* | (2006.01) |
| *H05K 1/02* | (2006.01) |
| *H05K 3/34* | (2006.01) |

(52) U.S. Cl.
CPC ............ *H05K 3/0011* (2013.01); *H05K 3/06* (2013.01); *H05K 3/282* (2013.01); *H05K 3/429* (2013.01); *H05K 3/462* (2013.01); *H05K 3/4623* (2013.01); *H05K 3/4644* (2013.01); *H05K 3/3447* (2013.01); *H05K 2201/09572* (2013.01); *H05K 2203/0502* (2013.01); *H05K 2203/0548* (2013.01)

(58) Field of Classification Search
CPC .. H05K 3/4046; H05K 3/4053; H05K 3/4061; H05K 3/4069; H05K 3/4076; H05K 3/4084; H05K 3/4092; H05K 3/42; H05K 3/421; H05K 3/422; H05K 3/423; H05K 3/424; H05K 3/425; H05K 3/426; H05K 3/427; H05K 3/428; H05K 3/429
See application file for complete search history.

(56) References Cited

U.S. PATENT DOCUMENTS

| | | | |
|---|---|---|---|
| 2007/0001295 | A1 | 1/2007 | Cho et al. |
| 2013/0143420 | A1* | 6/2013 | Light ................... H05K 3/4069 439/65 |

FOREIGN PATENT DOCUMENTS

| | | |
|---|---|---|
| JP | 2003-283084 A | 10/2003 |
| KR | 10-1994-0006435 A | 3/1994 |
| KR | 10-0498977 B1 | 7/2005 |
| KR | 10-0723489 B1 | 5/2007 |
| KR | 10-2015-0052492 A | 5/2015 |
| TW | 201616927 A | 5/2016 |

* cited by examiner

HIGH-CURRENT TRANSMITTING METHOD UTILIZING PRINTED CIRCUIT BOARD

CROSS-REFERENCE TO RELATED APPLICATION

This application claims priority to Korean Patent Application No. 10-2016-0070347 filed on Jun. 7, 2016 and all the benefits accruing therefrom under 35 U.S.C. § 119, the contents of which are incorporated by reference in their entirety.

BACKGROUND

The present disclosure relates to a structure and a method for filling via holes formed in a multilayer printed circuit board, and more particularly, to a structure and a method for filling via holes formed in multilayer printed circuit boards, the structure and method enabling high-current transmission even in a narrow space in such a way that a via hole formed when a general typical multilayer printed circuit board is manufactured is first filled with Cu and Ag plating, and the remaining vacant space is completely filled with a solder cream, thereby increasing the amount of conductors.

Printed circuit boards (PCBs) express the electrical wiring for connecting circuit components in wiring shapes on the basis of circuit design and reproduce electrical conductors on an insulator through a method suitable for the design. Various electronic components are mounted on such a printed circuit board, and wiring is formed such that the components are electrically connected.

Recently, along with the development of electronic devices, PCBs have been made to have a high-density or a multilayer. In such a manufacturing method of high-density/multilayered PCBs, a configuration for electrical connection and smooth current flow between the patterns formed in each layer is required.

According to a manufacturing process of multilayer PCBs, firstly, a printed circuit board having a copper foil formed on the entire surface thereof is prepared.

Next, a photosensitive resin film is printed on the surface of the copper foil layer using a wiring-patterned film. Using the characteristics of the photosensitive resin, a circuit forming step in which a wiring pattern is formed by etching a desired pattern on the copper foil layer is performed. After forming a circuit, a step in which the printed circuit board is heated and pressed by using a press to thereby successively laminate pattern layers and insulating layers is performed. Recently, a manufacturing method using lamination through a build-up method in which layers are laminated one-by-one has been widely used.

After the laminating step, a via hole processing step for electrical connection between the pattern layers is performed. When the via hole processing is completed, a plating process step for electrically connecting a plurality of laminated layers is required.

Through the plating process, the processed via holes are filled with metal, and the electrical connection between the pattern layers is thereby obtained. After the plating process step, printing a solder resist and printing letters are performed. The printing of a solder resist is used to minimally suppress the exposure of copper. In this step, although the portion connected to electronic components is not covered but exposed, non-required portions such as wiring portions are covered with a solder resist to prevent copper from being oxidized by air or peeled off by external shock, or to prevent a short-circuit. In the printing of letters, names of components to be mounted or names of constituent parts are printed.

Subsequently, the multilayer printed circuit board is manufactured through steps including an outer shape processing step for processing the outer shape of the printed circuit board so as to match the shapes of products and devices which are finally mounted, an appearance inspection step, an electrical inspection step, a film development step for producing a film for printing a wiring pattern or a solder resist, and the like.

In manufacturing the multilayer printed circuit board, the electrical connection of the circuit patterns between each layer built up through lamination is performed by mainly using a method in which the inner walls of via holes are made conductive through plating. Accordingly, in a manufacturing process of the multilayer printed circuit boards, a large number of via holes are formed to electrically connect each layer and ach circuit pattern with each other. Circuit patterns between the plurality of layers, which serve as upper or lower layers, are electrically connected through via holes filled with plating.

Typical via hole filling methods for electrically connecting circuit patterns include a first typical art in which via holes are made conductive in a hole shape, and then, the insides of the via holes are filled with insulating resins or conductive pastes. Also included is a second typical art in which a chemical plating layers and an electrical plating layers are formed on the side walls of the via holes, and then, the insides of the via holes are filled with a photosensitive ink. Further included is a third typical technique which is most widely used at present as the conductor patterns gradually become fine, and in which the insides the via holes are filled by using electrical copper plating.

SUMMARY

However, when the above typical arts are used, there are limitations in that not only voids are generated inside via holes and a phenomenon in which surfaces are concavely recessed occurs, but also connection reliability and the electrical conductivity are degraded due to the difference in thermal expansion coefficients of metal and insulating resin (typical art 1) and when etching for constituting a circuit is performed as a post-process, a short-circuit defect is caused because the plating layers are not easily etched by an etching solution due to ink serving as a fluid agent (typical art 2). Also, when the via holes are filled by using an electric copper plating technique, there are limitations in that the insides of the via holes are not properly filled or voids are generated inside the via holes even when the via holes are filled (typical art 3), and when a high current is allowed to flow in a typical general multilayer printed circuit board, much space is required in the printed circuit board, and when the space is not sufficient, heat is generated in the printed circuit board and thereby affects the peripheral components (shunt resister, FET, and the like) to degrade the accuracy of the components.

Accordingly, the present invention is provided to address the above limitations in typical arts, and proposes a structure and a method for filling via holes formed in a multilayer printed circuit board. The proposed method, in which via holes generated in manufacturing a general multilayer printed circuit board are firstly filled through a Cu and Au plating process, and the remaining spaces are completely filled with a solder cream, enables the transmission of a high-current even in a narrow space by increasing the amount of conductors such that the solder cream is stably deposited so as to fill the via holes without generating voids.

In accordance with an exemplary embodiment, a method for manufacturing a multi layer board (MLB) includes: a copper foil forming step for plating a copper foil on an entire surface of a laminated plate to form a plurality of copper foil laminated plates; an inner layer circuit printing step for coating the copper foil laminated plates formed in the copper foil laminated plate forming step with a photosensitive dry film and then with a master film on which a circuit is printed to form a circuit through light irradiation and development; an etching step for removing unnecessary copper foils from surfaces of the copper foil laminated plates on which the printing of inner layer circuit is completed, to form a circuit; a rest delaminating step for removing the dry film of a circuit portion to complete circuit formation; a laminating process step for laminating and attaching each copper foil plate in which the circuit formation is completed; a via hole processing step for forming via holes at positions connecting circuits located on layers different from each other in the laminated plates laminated in the laminating process step; a via hole plating step for plating the inside of the holes to be electrically connectable after processing the via holes in the via hole processing step; a solder mask printing process step for applying a solder mask insulating ink to prevent the generation of a bridge of the soldering solder and the oxidation of exposed circuits when surface mounting for mounting components on an uppermost laminated substrate is performed; a solder cream filling step for filling a vacant space of the via holes filled with plating when surface mounting for mounting components on a laminated substrate is performed; and a step for completely filling the holes filled with the solder cream in the solder cream filling step by performing a reflow of the solder cream.

The via hole plating step may include firstly plating Cu and secondly plating Au.

In accordance with an exemplary embodiment, a multilayer printed circuit board each layer of which is printed with a circuit pattern includes via holes for connecting circuits of each layer, wherein the via hole includes: a plating layer formed on a side wall thereof; and a solder cream filled in a vacant surface of the via holes on which the plating layer is formed.

The plating layer on the side wall of the via holes may include: a Cu plating layer plated with Cu; and an Au plating layer formed on the Cu plating layer.

The solder dream may be reflowed.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
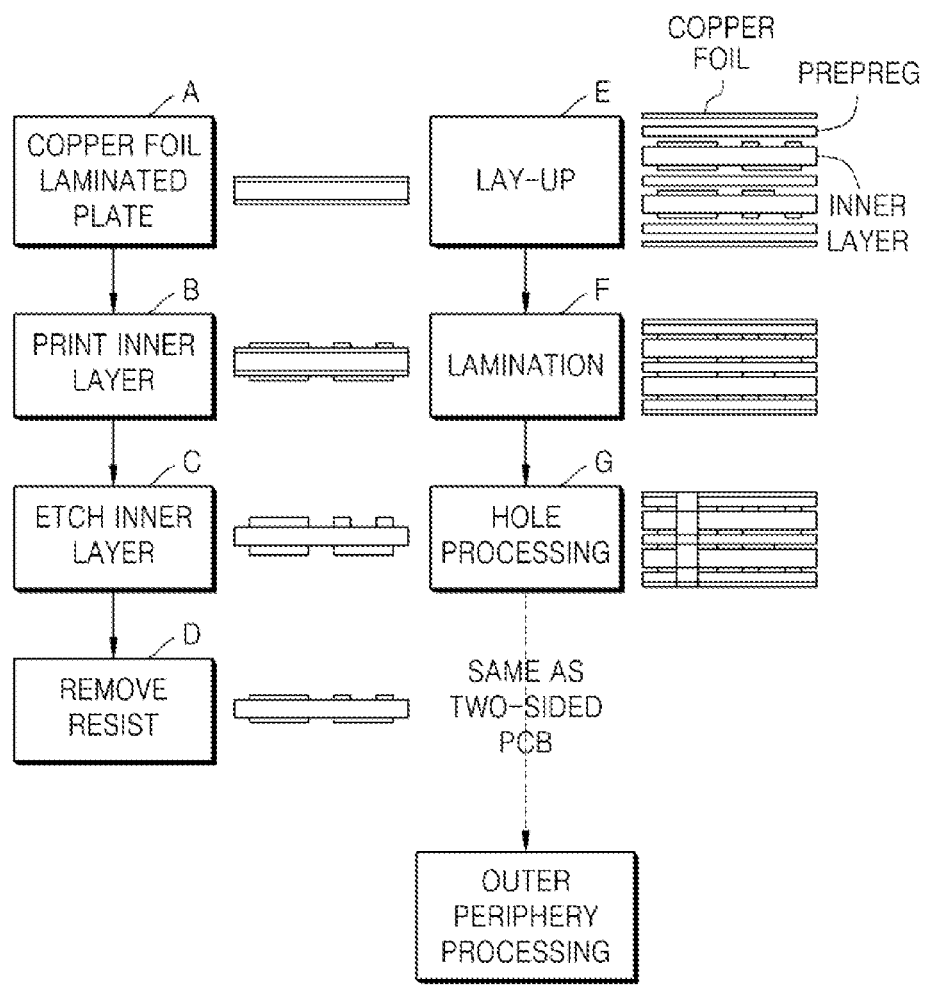
FIG. 1 is a view illustrating a typical manufacturing process for a multilayer printed circuit board.

Hereinafter, exemplary embodiments of the present invention will be described in detail with reference to the accompanying drawings so as to be easily implemented by those skilled in the art. The present invention may, however, be embodied in different forms and should not be construed as limited to the embodiments set forth herein. In the figures, the portions unrelated to descriptions are not provided for clarity of illustration, and like reference numerals refer to like elements throughout.

Throughout the specification, when a portion "includes" a component, it does not mean other components are not excluded as long as no opposing indication is present, but means other components may further be included. The terms "a step for" or "a step of" used throughout the specification of the present application does not mean "a step for the purpose of".

The present invention provides a structure and a method for filling via holes generated in manufacturing process of a multilayer printed circuit board, the method including: firstly filling the insides of the via holes by using a plating process; and secondly filling the holes with a solder cream to completely fill the holes.

In addition, the multilayer printed circuit board described in the present invention has substrates laminated in four or more layers.

The present invention propose a structure and a method for filling via holes generated in manufacturing process of a multilayer printed circuit board, the method enabling the transmission of a high-current even in a narrow space by increasing the amount of conductors such that via holes generated in manufacturing a multilayer printed circuit board are completely filled by using the plating process and the solder cream.

Hereinafter, among such processes, substrate manufacturing methods serving as a background of the present invention will be described to describe the exemplary embodiment.

FIG. 1 is a schematic view illustrating a manufacturing process for multilayer board (MLB) used in typical arts.

(A) is a copper foil laminated plate preparing step for preparing a copper foil laminated plate formed by plating a copper foil on the entire surface of the laminated plate.

(B) is an inner layer circuit printing step, in which a photograph printing method or a screen printing method is used. The photograph printing method is used for the MLB. In this step, the method of forming a circuit by using a photograph capturing method is applied such that a photosensitive dry film is closely applied by using heat and pressure on the surface of raw material of the copper foil laminated plate for inner layers, then a master film on which a circuit is printed is applied and irradiated with light, and then a circuit is formed through development.

(C) and (D) are an inner layer etching step and a resist delaminating step, in which unnecessary portions except for a circuit portion are removed by using a chemical having a strong etching property from the surface of a raw plate for inner layers on which circuit formation is completed by the photograph printing method, and a circuit is thereby formed, and then, the circuit formation is completed by delaminating the dry film which has prevented etching by being applied only to the circuit portion.

The dry film described in the steps (B), (C) and (D) is the same term as an etching resist.

(E) is a lay-up step in which the inner layer raw plate on which the circuit is formed, a prepreg, and a copper foil are laminated to overlap according to a design specifications.

(F) is a laminating step, in which in a state of completing the lay-up step, the resultant is put into a press, the prepreg is melted/cured by being pressed and heated, and the copper foil and the inner layer raw plate are thereby attached to form an MLB.

(G) is a via hole processing and plating step, and the via hole processing is a step of forming a hole in the printed circuit board so as to enable electrical connection between circuits.

Since the wall surface inside the formed holes after the via holes are processed is not conductive, the wall surface is plated with a conductive material so as to be electrically connected, that is, plated with copper (Cu). In the via hole plating step, the inner walls of the formed via holes do not have electrical property, the inner walls may be firstly coated by using chemical agents through electroless copper plating which does not require electricity, and then secondly coated through electrical copper plating. The common plating thickness of printed circuit boards is in the level of approximately 20-30 μm and may be decreased to approximately 10-15 μm when the printed circuit boards are gradually made to have fine patterns.

Subsequently, to prevent bridge generation in the soldering solder and the oxidation of exposed circuits, a solder mask printing process step for applying a solder mask insulating ink is included.

After the mask printing process step, a surface mounting (SMT) process step for mounting components on an electronic substrate is further included.

Exemplary embodiments provide a structure and a method for filling holes formed in an MLB, the method being applied to the hole plating step and the SMT process step from among the above-described processes, and the method enabling the transmission of a high-current even in a narrow space in such a way that via holes generated in manufacturing an MLB are firstly filled through a copper plating process, a solder cream is then filled in the remaining vacant space of the holes in the SMT process step, and then, the via holes are completely filled by performing a reflow.

Figure 2:
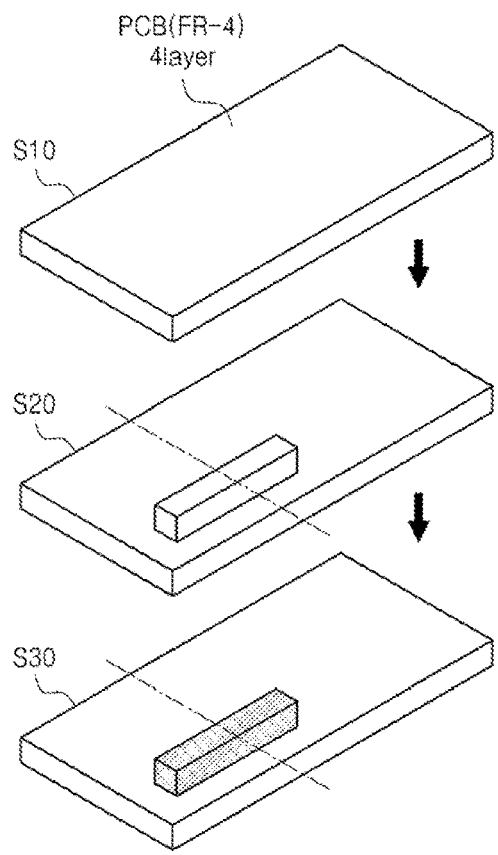
FIG. 2 is a view illustrating a filling process of via holes in accordance with an exemplary embodiment.

FIG. 2 is a view illustrating a hole filling process in accordance with an exemplary embodiment.

As described in detail in FIG. 1, an exemplary embodiment may be applied by using an MLB which pass through the laminating step (E) and in which four of more layers are laminated (S10).

(S20) is a step of forming holes for electrically connecting circuit patterns.

In this step, holes are formed in a designed diameter for circuit conduction required between each layer in a two-sided board or a laminated board or for mounting components.

In step (S30), formed via holes 10 are firstly filled through a plating process. The plating process may be performed through Cu and Au plating. In the plating process, electroless plating may be firstly performed on the inner wall of the via holes 10 before performing Cu and Au plating. Since the conductive layer 40 in the formed via hole 10 is separated by an insulating layer 30, the electroless plating may be a process performed to impart conductivity to the surface in the hole wall. Subsequently, Cu is plated on the inner wall of the via holes 10 to form a Cu plating layer 50. Au is plated on the Cu plating layer to form an Au plating layer 60.

After the Cu plating layer 50 and the Au plating layer 60 are formed, a solder cream 70 is filled in the remaining vacant space in the SMT process step. After the solder cream 70 is filled at least once in the vacant space of the via holes 10, a reflow is performed to completely fill the via hole 10 without a vacant space.

The reflow is a technical process in which components are reliably jointed to a printed circuit board by melting the solder cream by applying a high-temperature heating source to mount components on a printed circuit board to electrically connect the printed circuit board and the components. Accordingly, after the solder cream 70 is filled in the vacant space of the via hole 10, the reflow process is performed to completely fill the via hole without a vacant space due to the high-temperature heat source.

The solder cream 70 is reflowed.

Figure 3:
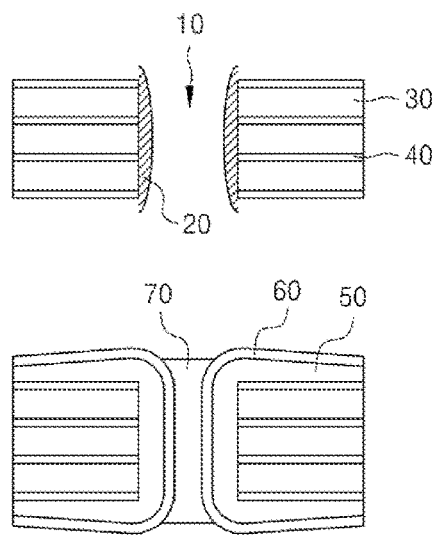
FIG. 3 is a view illustrating a filling structure of a via hole in accordance with an exemplary embodiment.

FIG. 3 is a view illustrating a filling structure of a via hole in accordance with an exemplary embodiment.

Before the plating process for filling the via hole 10 formed in a board in which multiple layers are laminated, an electroless plating layer 20 may be formed on the surface in the wall of the via hole 10. Since the conductive layer 40 in the formed via hole 10 is separated by an insulating layer 30, the electroless plating may be a process performed to impart conductivity to the surface in the hole wall of the via hole 10. Accordingly, the electroless plating layer 20 may be formed on the surface in the wall of the via hole 10

According to the structure for filling via holes, a Cu plating layer 50 is formed on the side wall of the via hole. An Au plating layer 60 is formed on the Cu plating layer.

The Cu plating layer 50 and the Au plating layer 60 may also be formed outside the via hole.

After the Cu plating layer 50 and the Au plating layer 60 are formed, a solder cream 70 is filled in the remaining vacant space in the via hole 10. After filling the solder cream 70, the solder cream 70 may fill the via hole 10 without a vacant space by performing a reflow of the SMT process.

Figure 4:
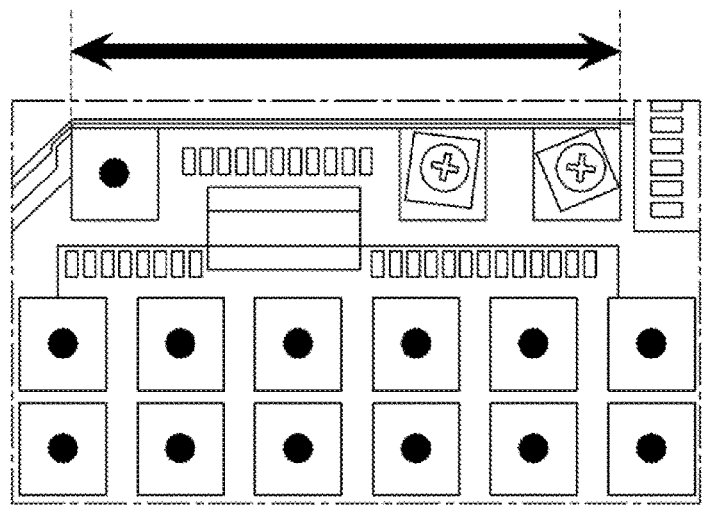
FIG. 4 is a designed photograph of a typical multilayer printed circuit board.

FIG. 4 is a real object photograph of a printed circuit board designed by applying a typical art and a heating temperature measured during high-current transmission.

As confirmed in FIG. 4, the printed circuit board designed by applying typical arts occupies a width of approximately 90 mm, and a shunt resistor is designed in a space of approximately 26.5 mm.

Figure 5:
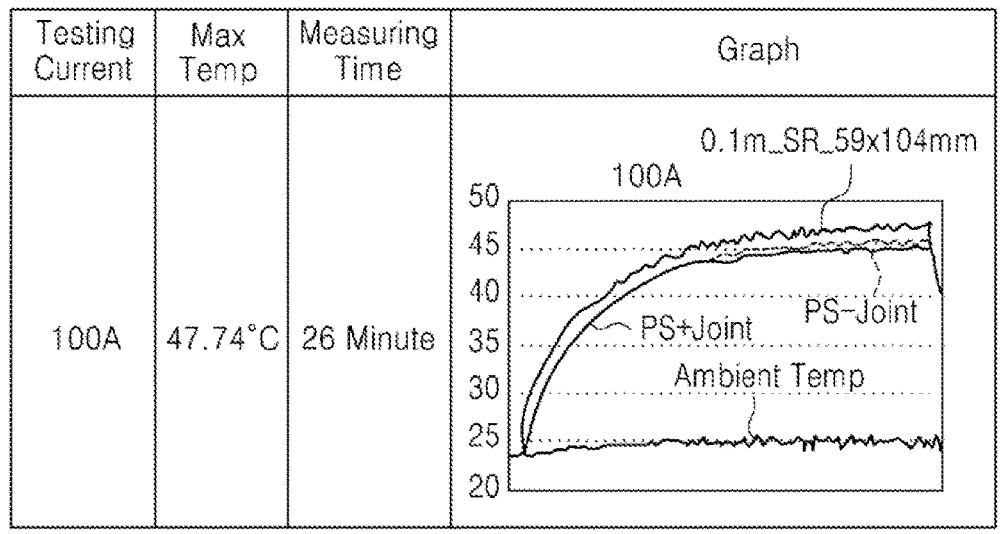
FIG. 5 is an experimental graph measuring the heating temperature of a typical printed circuit board.

FIG. 5 is an experimental graph in which heating temperatures are measured during a measuring time when a high-current of approximately 100 A is transmitted to a typical printed circuit board.

In the graph, each of PS− joint and PS+ joint refer to power cables used in design, Ambient Temo refers to an ambient temperature of the printed circuit board, 0.1 m_SR_59×104 mm refers to components used in design, and the heating temperature of the components is the most important factor in designing the printed circuit board.

In the graph, it can be confirmed that PS− joint, PS+ joint, and 0.1 m_SR_59×104 mm are gradually increased to exhibit a curved shape, and Ambient Temo exhibits a constant straight line shape from the time of starting measurement.

The measured maximum heating temperatures was approximately 46° C. for PS− joint, approximately 45° C. for PS+ joint, approximately 47.74° C. for 0.1 m_SR_59× 104 mm, and approximately 25° C. for Ambient Temo.

Figure 6:
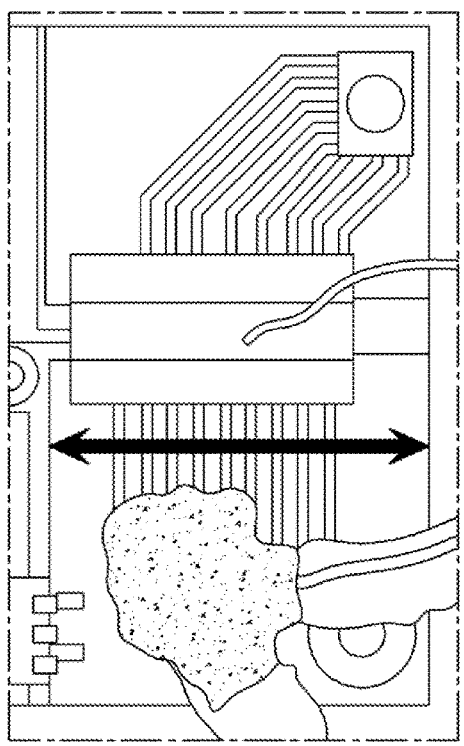
FIG. 6 is a designed photograph of a printed circuit board.

FIG. 6 is a designed photograph of a printed circuit board.

As confirmed in FIG. 6, the printed circuit board in accordance with an exemplary embodiment was designed in a width of approximately 36 mm.

Figure 7:
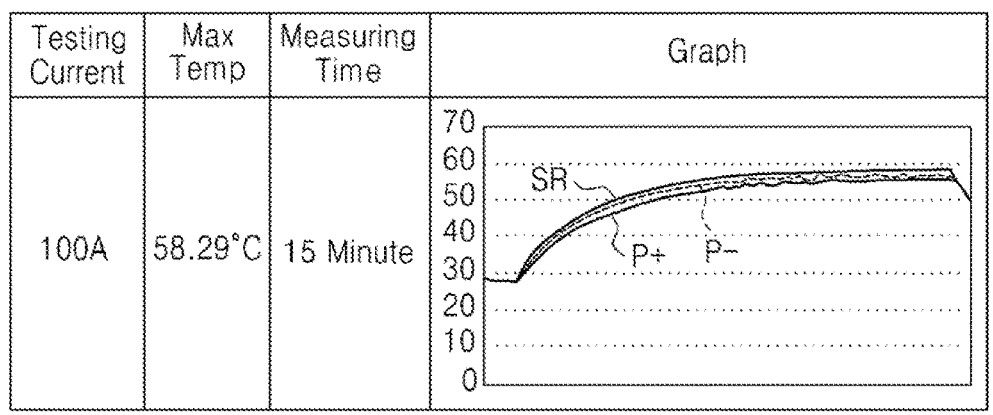
FIG. 7 is an experimental graph in which heating temperatures of the printed circuit board in accordance with an exemplary embodiment are measured.

FIG. 7 is an experimental graph in which heating temperatures of the printed circuit board in accordance with an exemplary embodiment are measured during a measuring time when a high-current of approximately 100 A is transmitted to the printed circuit board.

In the graph of FIG. 7, P+ and P− refer to power cables like PS− joint and PS+ joint in the graph of FIG. 5, and SR is the same component as 0.1 m_SR_59×104 mm.

It can be understood from the graph of FIG. 7 that only P− was measured as a temperature of approximately 29° C. in an initial stage of measuring time, and from a certain time point, P+, P−, and SR form curved shapes while exhibiting increases in similar shapes.

As confirmed from FIGS. 4 and 6, when designing the typical printed circuit board and the printed circuit board in accordance with an exemplary embodiment, a high-density design was performed such that the space occupied by the printed circuit boards was decreased from approximately 90 mm to approximately 36 mm. In addition, the maximum heating temperature measured during transmission of a high current of approximately 100 A was approximately 47.74° C. as in FIG. 5, and approximately 58.29° C. in FIG. 7, and accordingly, the design width is remarkably reduced, but the heating amount generated during high-current transmission is not much increased, and thus the accuracy can be maintained at the present level because the heating does not affect ambient components.

In accordance with an exemplary embodiment, provided is a method of completely filing via holes with a Cu and Au plating process and a solder cream, the via holes being formed when a general multilayer printed circuit board is manufactured by using a general multilayer printed circuit board and a surface mounting (SMT) process without using a special manufacturing technique for multilayer printed circuit board. Since the inner walls of the via holes are filled with metal through the plating process and the solder cream is additionally filled in the via holes, the solder cream is reliably deposited on the hole, the holes are thereby completely filled, and the amount of conductors is thereby increased. Thus, it is possible to transmit a high current even in a narrow space. Accordingly, the method is inexpensive because a special manufacturing cost is not required, and the space of the multilayer printed circuit board can be efficiently used.

That is, by being filled with the solder cream after the metal plating process, the via holes which have not been completely filled with metal plating only, can be completely filled with the solder cream. Furthermore, since the metal plating layer plated on the inner walls of the via holes hold the solder cream such that the solder cream is reliably deposited and is not easily detached, there is an effect in that the filled state of the via holes can be stably maintained.

Accordingly, it can be confirmed that the printed circuit board is designed so as to enable high-current transmission even in a narrow space.

What is claimed is:

1. A multilayer printed circuit board each layer of which is printed with a circuit pattern, the multilayer printed circuit board comprising via holes for connecting circuits of each layer, wherein each via hole is a through hole having a pair of open ends, and wherein each via hole comprises:
    a plating layer formed on a side wall of the via hole, the plating layer including a Cu plating layer plated with Cu on the side wall of the via hole and an Au plating layer formed on the Cu plating layer; and
    a solder cream on the Au plating layer and filled in a vacant surface of the via holes on which the plating layer is formed.

2. The multilayer printed circuit board of claim 1, wherein the solder cream is reflowed.

3. The multilayer printed circuit board of claim 1, wherein the Cu plating layer includes:
    a first coating of Cu on the insides of the via holes formed by electroless copper plating; and
    a second coating of Cu on the insides of the via holes formed by electrical copper plating.

4. A method for manufacturing a multilayer printed circuit board (MLB), comprising:
    a copper foil forming step for plating a copper foil on an entire surface of a laminated plate to form a plurality of copper foil laminated plates;
    an inner layer circuit printing step for coating the copper foil laminated plates formed in the copper foil laminated plate forming step with a photosensitive dry film and then with a master film on which a circuit is printed to form a circuit through light irradiation and development;
    an etching step for removing unnecessary copper foils from surfaces of the copper foil laminated plates on which the printing of inner layer circuit is completed, to form a circuit;
    a rest delaminating step for removing the dry film of a circuit portion to complete circuit formation;
    a laminating process step for laminating and attaching each copper foil plate in which the circuit formation is completed;
    a via hole processing step for forming via holes at positions connecting circuits located on layers different from each other in the laminated plates after the laminating process step;
    a via hole plating step for plating the inside of the holes to be electrically connectable after processing the via holes in the via hole processing step;
    a solder mask printing process step for applying a solder mask insulating ink to prevent the generation of a bridge of the soldering solder and the oxidation of exposed circuits when surface mounting for mounting components on an uppermost laminated substrate is performed;
    a solder cream filling step for filling a vacant space of the via holes filled with plating when surface mounting for mounting components on the laminated plates is performed; and
    a step for completely filling the holes filled with the solder cream in the solder cream filling step by performing a reflow of the solder cream.

5. The method of claim 4, wherein the via hole plating step comprises firstly plating Cu and secondly plating Au.

6. The method of claim 4, wherein the via hole plating step comprises:
    first coating Cu on the insides of the via holes using electroless copper plating; and
    second coating Cu on the insides of the via holes using electrical copper plating.

* * * * *